US012795953B2

(12) United States Patent
Zhou et al.

(10) Patent No.: US 12,795,953 B2
(45) Date of Patent: Nov. 10, 2026

(54) SEMICONDUCTOR DEVICE WITH A THROUGH VIA BETWEEN REDISTRIBUTION LAYERS

(71) Applicant: Micron Technology, Inc., Boise, ID (US)

(72) Inventors: Wei Zhou, Boise, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 321 days.

(21) Appl. No.: 18/736,187

(22) Filed: Jun. 6, 2024

(65) Prior Publication Data

US 2025/0008750 A1 Jan. 2, 2025

Related U.S. Application Data

(60) Provisional application No. 63/524,533, filed on Jun. 30, 2023.

(51) Int. Cl.
*H10B 80/00* (2026.01)
*H10W 90/00* (2026.01)
(Continued)

(52) U.S. Cl.
CPC ........... *H10B 80/00* (2023.02); *H10W 90/00* (2026.01); *H10W 80/312* (2026.01);
(Continued)

(58) Field of Classification Search
CPC .... H10B 80/00; H10W 72/072; H10W 72/20; H10W 72/90; H10W 80/312;
(Continued)

(56) References Cited

U.S. PATENT DOCUMENTS

2016/0260695 A1 9/2016 Chung et al.
2016/0260698 A1 9/2016 Oh et al.
(Continued)

FOREIGN PATENT DOCUMENTS

CN 113838822 A 12/2021
KR 20130052179 A 5/2013
TW 201712828 A 4/2017

OTHER PUBLICATIONS

International Application No. PCT/US2024/033881—International Search Report and Written Opinion, mailed Oct. 15, 2024, 7 pages.
(Continued)

*Primary Examiner* — Jaehwan Oh
(74) *Attorney, Agent, or Firm* — Dorsey & Whitney LLP

(57) ABSTRACT

A semiconductor device with a through via between redistribution layers is disclosed. The semiconductor device includes a stack of semiconductor dies coupled with first contact pads on a first redistribution layer. The first redistribution layer further includes a second contact pad located outside the footprint of the die stack and circuitry coupling the second contact pad to the first contact pads. A gap fill is disposed around the stack of semiconductor dies. A second redistribution layer is disposed at the stack of semiconductor dies and the gap fill. The second redistribution layer includes third contact pads coupled with the stack of semiconductor dies, a fourth contact pad disposed beyond the footprint of the stack of semiconductor dies, fifth contact pads opposite the third and fourth contact pads, and circuitry coupling the contact pads. A through via is disposed through the gap fill coupling the second and fourth contact pads.

20 Claims, 7 Drawing Sheets

(51) Int. Cl.
*H10W 80/00* (2026.01)
*H10W 90/20* (2026.01)

(52) U.S. Cl.
CPC ........ *H10W 80/327* (2026.01); *H10W 90/288* (2026.01); *H10W 90/297* (2026.01); *H10W 90/792* (2026.01)

(58) Field of Classification Search
CPC . H10W 80/327; H10W 90/00; H10W 90/288; H10W 90/297; H10W 90/722; H10W 90/724; H10W 90/792
See application file for complete search history.

(56) References Cited

U.S. PATENT DOCUMENTS

| | | | | |
|---|---|---|---|---|
| 2020/0091215 | A1 | 3/2020 | Jang et al. | |
| 2020/0203303 | A1* | 6/2020 | Lin | H10W 70/614 |
| 2021/0118847 | A1* | 4/2021 | Chuang | H10P 72/74 |
| 2021/0193581 | A1 | 6/2021 | Seo et al. | |
| 2022/0028834 | A1 | 1/2022 | Lee et al. | |
| 2023/0170327 | A1 | 6/2023 | Yang et al. | |
| 2024/0088085 | A1* | 3/2024 | Lin | H10W 70/614 |

OTHER PUBLICATIONS

Taiwan IPO Office Action issued Mar. 25, 2025 for application No. 113123552, Applicant: Micron Technology, Inc., 20 pages.

* cited by examiner

SEMICONDUCTOR DEVICE WITH A THROUGH VIA BETWEEN REDISTRIBUTION LAYERS

CROSS-REFERENCE TO RELATED APPLICATION(S)

The present application claims priority to U.S. Provisional Patent Application No. 63/524,533, filed Jun. 30, 2023, the disclosure of which is incorporated herein by reference in its entirety.

TECHNICAL FIELD

The present disclosure generally relates to semiconductor device assemblies and more particularly relates to a semiconductor device with a through via between redistribution layers.

BACKGROUND

Microelectronic devices generally have a die (e.g., a chip) that includes integrated circuitry with a high density of very small components. Typically, dies include an array of bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals and encapsulating the dies to protect them from environmental factors (e.g., moisture, particulates, static electricity, and physical impact).

DETAILED DESCRIPTION

Figure 1:
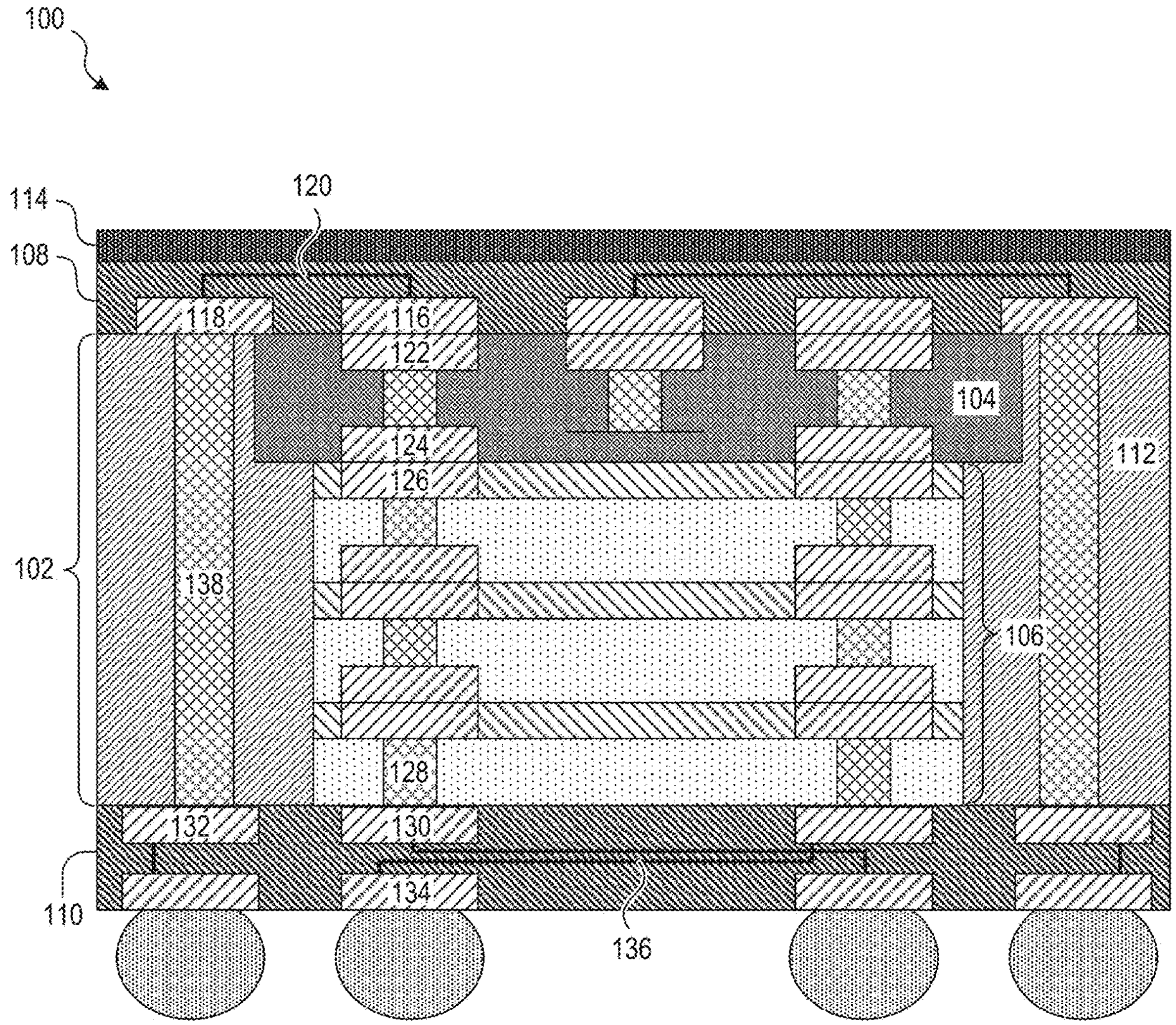
FIG. 1 illustrates a simplified schematic cross-sectional view of a semiconductor device assembly in accordance with an embodiment of the present technology.

Multiple semiconductor dies can be packaged into a single semiconductor device that can operate cooperatively and provide a particular functionality; however, this design can also introduce various challenges. For example, semiconductor devices can be at risk of overheating due to an increased amount of heat generated by multiple dies within a single package. These dense package structures can require complex routing that dictates the positioning of semiconductor dies within the package. For example, semiconductor dies that include dense circuitry or require large amounts of external connections (e.g., power, ground, input/output (I/O)) to operate are positioned within the package at locations that prioritize connectivity over thermal advantages. Often, however, these same semiconductor dies (e.g., logic dies) produce the largest amount of heat due to the density of circuitry within these dies or the large power distributions required to operate these dies. Thus, semiconductor devices can benefit from alternate thermal regulation techniques, particularly those that prioritize thermal dissipation from semiconductor devices that produce a great amount of heat (e.g., logic dies).

Take, for example, a memory device that includes a logic die (e.g., a memory controller or interface die) and one or more memory dies within a single package. In one design, the memory dies can be stacked onto the logic die such that the logic die is placed at the bottom of the package. In this way, the semiconductor die producing the greatest amount of heat, the logic die, is located farthest from an upper surface of the package through which heat can be dissipated most efficiently (e.g., due to thermal components, such as heat sinks and heat spreaders, disposed thereat). As a result, this design may suffer from poor thermal regulation, which can damage and decrease the efficiency of the device.

In contrast to this design, when high-heat-producing dies are implemented at the top of a package (e.g., the logic die is implemented above the one or more memory dies), heat can more easily dissipate from the logic die through the upper surface of the package. In this arrangement, however, it can be difficult to implement the number of external connections necessary to provide adequate connectivity to the logic die. For example, external connectivity can be provided by implementing pass-through vias through the memory dies on which the logic die is stacked. When large amounts of pass-through vias are implemented through the memory dies, these pass-through vias can utilize a large portion of the circuit area on the memory dies. In doing so, the space available for circuitry implemented on the memory dies can be limited, which can increase routing complexity or reduce memory capacity, efficiency, or reliability.

To address these problems and others, the present technology relates to a semiconductor device assembly with a through via between redistribution layers. In some embodiments, the semiconductor device includes a stack of semiconductor dies coupled with first contact pads on a first redistribution layer. The first redistribution layer further includes at least one second contact pad located outside the footprint of the die stack. A gap fill is disposed around the stack of semiconductor dies to protect and support the semiconductor dies. A second redistribution layer is disposed at the stack of semiconductor dies and the gap fill. The second redistribution layer includes third contact pads coupled with the stack of semiconductor dies and at least one fourth contact pad disposed beyond the footprint of the stack of semiconductor dies. The second redistribution layer further includes fifth contact pads that connect to external components (e.g., through solder balls or other connective elements) to provide additional functionality to the device (e.g., power, ground, I/O signaling). Circuitry within the second redistribution layer connects the fifth contact pads to the third contact pads and the at least one fourth contact pad to provide connectivity (e.g., power, ground, I/O signaling) to the semiconductor device. Specifically, a subset of the fifth contact pads can connect to the at least one fourth contact pad, and a through via can extend through the gap fill to couple the at least one fourth contact pad with the at least one second contact pad. As a result, the through via can be used to communicate power, ground, I/O, or other signaling from the external components to one or more semiconductor dies at the top of the assembly without utilizing limited available circuit area on lower semiconductor dies on which the top semiconductor die is stacked. For instance, embodiments of the present technology can provide adequate connectivity to the top semiconductor die while limiting the number of through vias implemented through the lower semiconductor dies.

FIG. 1 illustrates a semiconductor device assembly 100 that includes a stack of semiconductor dies 102, including a semiconductor die 104 (e.g., a logic die) and one or more semiconductor dies 106 (e.g., memory dies), coupled (e.g., electrically and mechanically) with one another and the semiconductor die 104 (e.g., a logic die). In some implementations, the stack of semiconductor dies can be a heterogenous stack. In some implementations, the semiconductor device assembly 100 is a memory device. In this way, the semiconductor die 104 can implement an interface die or a memory controller, and the semiconductor dies 106 can comprise memory dies. As a specific example, the semiconductor device assembly 100 can include a high-bandwidth memory (HBM) device (e.g., a customized HBM device) or tightly coupled memory (TCM) device. In some embodiments, the semiconductor die 104 may require adequate connectivity to receive power, ground, I/O, or other signaling from external components with which the semiconductor device assembly 100 is coupled.

The semiconductor die 104 is coupled with a redistribution layer 108 at a first side of the stack of semiconductor dies 102, and at least one of the semiconductor dies 106 is coupled with a redistribution layer 110 at a second side of the stack of semiconductor dies 102 opposite the first side of the stack of semiconductor dies 102. Thus, the semiconductor die 104 can be implemented at the top of the assembly 100 farthest from external components with which the assembly is coupled. A gap fill 112, such as a dielectric fill (e.g., silicon oxide, silicon nitride, silicon carbide, or silicon carbon nitride), oxide fill (e.g., silicon oxide), or mold resin, is disposed around the stack of semiconductor dies 102 between the redistribution layer 108 and the redistribution layer 110. The redistribution layer 108 and the redistribution layer 110 can be disposed at opposite ends of the gap fill 112.

The redistribution layer 108 can be disposed on a substrate 114 (e.g., a semiconductor substrate, such as a silicon interposer) at a side that faces the stack of semiconductor dies 102. The substrate 114 can provide stability and rigidity to the semiconductor device assembly 100, allowing other dies within the stack of semiconductor dies 102 (e.g., one of the semiconductor dies 106 furthest from the substrate 114) to be thinner. If additional rigidity or stability is needed, the thickness of the substrate 114 can be varied. The redistribution layer 108 can include one or more layers of conductive material and insulating material (e.g., dielectric material) disposed on the substrate 114 to implement circuitry that couples the redistribution layer 108 to the semiconductor die 104. Specifically, the redistribution layer 108 includes contact pads 116 within a footprint of the stack of semiconductor dies 102 (e.g., a projection of the stack of semiconductor dies 102 onto the redistribution layer 108) and at least one contact pad 118 beyond the footprint of the stack of semiconductor dies 102. Connective circuitry 120 (e.g., traces, lines, vias, or other connective elements) couples the contact pads 118 and one or more of the contact pads 116. In this way, signaling can be communicated between the contact pad 118 and connected ones of the contact pads 116 through the connective circuitry 120.

The contact pads 116 couple with contact pads 122 on the semiconductor die 104. For example, the contact pads 116 and the contact pads 122 can couple through hybrid bonding to form interconnects between the redistribution layer 108 and the semiconductor die 104. In other cases, the contact pads 116 and the contact pads 122 can couple through other conductive structures (e.g., solder joints). The contact pads 122 can connect to circuitry at the semiconductor die 104. For example, a front side of the semiconductor die 104 at which the circuitry (e.g., transistors, diodes, and other functional circuitry) is disposed can be faced away from the redistribution layer 108. In this way, the contact pads 122 can connect to the circuitry using through-silicon vias (TSVs). In other cases, the front side of the semiconductor die 104 can face toward the redistribution layer 108 such that the contact pads 122 couple with the circuitry at the semiconductor die 104 exclusive of TSVs.

The semiconductor die 104 can include contact pads 124 opposite the contact pads 122 and coupled with the functional circuitry at the semiconductor die 104. The contact pads 124 can couple with contact pads 126 on a first side of the semiconductor dies 106 to form interconnects that couple the semiconductor die 104 and the semiconductor dies 106. The semiconductor dies 106 can be coupled with one another through interconnects (e.g., formed from traces, lines, vias, TSVs, and other connective elements) between the dies. In this way, signaling can be communicated between the semiconductor die 104 and any of the semiconductor dies 106. The semiconductor dies 106 can be coupled to the semiconductor die 104 and one another such that the front side of each of the semiconductor dies 106 faces toward the semiconductor die 104.

TSVs 128 at a side of the stack of semiconductor dies 102 opposite the redistribution layer 108 can be exposed. The redistribution layer 110 can be disposed at the stack of semiconductor dies 102 and the gap fill 112 opposite the redistribution layer 108. In some cases, the redistribution layer can be a pre-built redistribution layer 110 routing contacts from a first configuration at a first side to a second configuration at a second side. Thus, the stack of semiconductor dies 102 can be coupled with the redistribution layer 110 through connective structures, such as solder. The redistribution layer 110 can include layers of conductive material and insulating material to implement circuitry. Specifically, the redistribution layer 110 includes contact pads 130 disposed within the footprint of the stack of semiconductor dies 102 and coupled with the TSVs 128 and at least one contact pad 132 disposed beyond the footprint of the stack of semiconductor dies 102 (e.g., at a lateral location that corresponds to the at least one contact pad 118). The contact pads 130 and the at least one contact pad 132 can be disposed at a side of the redistribution layer 110 that faces the stack of semiconductor dies 102. The redistribution layer 110 can further include contact pads 134 (e.g., package-level contact pads leading to external components to which the assembly 100 is coupled) disposed at a side of the redistribution layer 110 opposite the stack of semiconductor dies 102. The contact pads 134 can be at least partially separated from the contact pads 130 and the at least one contact pad 132 by a layer of insulating material.

Connective circuitry 136 (e.g., traces, lines, vias, or other connective elements) can couple the contact pads 134 with the contact pads 130 and the contact pad 132. For example, a first subset of contact pads 134 can couple with the contact pads 130 through the circuitry 136, and a second subset of contact pads 134 can couple with the at least one contact pad 132 through the circuitry 136. In this way, the connective circuitry 136 can communicate signaling (e.g., power, ground, I/O) from the contact pads 134 to the contact pads

130 and the at least one contact pad 132, and vice versa. The circuitry 136 can route the contact pads 130 and the at least one contact pad 132 to the contact pads 134, which are arranged in a configuration compatible with an external component to which the semiconductor device assembly 100 attaches (e.g., a motherboard). By varying the arrangement of the contact pads 134, the semiconductor device assembly 100 can comport with any external component to which it is attached (e.g., substrates, motherboards, or redistribution layers). As a particular example, the contact pads 134 can be arranged in a ball grid array (BGA) configuration. Solder or other connective structures can be disposed at the contact pads 134 to connect the assembly 100 with the external component.

At least one through via 138 can be disposed through the gap fill 112 beyond a footprint of the stack of semiconductor dies 102. The at least one through via 138 can couple the at least one contact pad 132 and the at least one contact pad 118 to enable signaling to be communicated between the redistribution layer 110 and the redistribution layer 108. In this way, signaling can pass from external components connected to the contact pads 134 to the redistribution layer 108, and vice versa, through the circuitry 136, the at least one contact pad 132, the at least one through via 138, and the at least one contact pad 118. The circuitry 120 can then communicate signals between the at least one contact pad 118 and the contact pads 116 to communicate signaling to/from the semiconductor die 104. In some cases, the circuitry 120 couples the at least one contact pad 118 to one or more of the contact pads 116 that couple with the functional circuitry at the semiconductor die 104 but does not couple directly with interconnects that couple the semiconductor dies 106 with the semiconductor die 104. Alternatively or additionally, the circuitry 120 can couple the at least one contact pad 118 with one or more contact pads 116 that directly couple with interconnects coupling the semiconductor dies 106 and the semiconductor die 104, thereby enabling signaling to pass from the contact pads 134 to the semiconductor dies 106 through the through via 138.

The at least one through via 138 can provide power, ground, I/O, or other signaling to the semiconductor die 104 (or any of the semiconductor dies 106) by coupling the at least one contact pad 132 to contact pads 134 that correspond to external components providing power, ground, I/O, or other signaling. The signaling can pass between the redistribution layer 110 to the redistribution layer 108 using the through via 138. In doing so, the number of through vias that are implemented through the semiconductor dies 106 (e.g., without connecting to functional circuitry at these dies) to connect the functional circuitry at the semiconductor die 104 and the redistribution layer 110 can be reduced. Any number of through vias can be implemented through the gap fill 112 beyond the footprint of the stack of semiconductor dies. Accordingly, a greater number of designs can be implemented due to the increased flexibility resulting from the ability to implement interconnects between the redistribution layer 110 and the semiconductor die 104 (or the semiconductor dies 106) within the gap fill 112.

In some cases, the semiconductor device assembly 100 can still include one or more through vias extending through the semiconductor dies 106 (e.g., without connecting to functional circuitry on these dies) to the semiconductor die 104 (e.g., using the contact pads 130 and the contact pads 124). For example, the various power, ground, I/O, and other signal paths can be implemented through a combination of through vias passing through the gap fill 112 and through vias passing through the semiconductor dies 106. In some embodiments, signaling can be communicated directly between the redistribution layer 110 and the semiconductor dies 106 (e.g., using the contact pads 130 and the TSVs 128) without passing through the through via 138. Thus, adequate connectivity can be provided to the semiconductor device assembly using any number of through vias extending through the gap fill 112 and any number of interconnects implemented within the stack of semiconductor dies 102.

In some embodiments, the semiconductor device assembly 100 can include a dummy through via that extends at least partially through the gap fill 112. The dummy through via can be electrically isolated from circuitry at the semiconductor device assembly 100 (e.g., in the redistribution layer 108 or the redistribution layer 110). Thus, the dummy through via does not communicate signaling to the semiconductor die 104 or the semiconductor dies 106. Instead, the dummy through via can be used to dissipate heat from the semiconductor device assembly 100.

Although the stack of semiconductor dies 102 is illustrated as four semiconductor dies, other implementations are possible that include more or fewer semiconductor dies. For example, the stack of semiconductor dies 102 can be replaced with a single semiconductor die or a stack of semiconductor dies having 2, 3, 5, 6, 8, 10, 12, 14, 16, or any other number of semiconductor dies. In some embodiments, the semiconductor die 104 could be replaced with multiple semiconductor dies (e.g., spaced laterally along the redistribution layer 108 or stacked onto one another). In aspects, the semiconductor dies 106 could be replaced with more or fewer semiconductor dies or multiple stacks of semiconductor dies coupled to different lateral locations on the semiconductor die 104. For example, multiple stacks of the semiconductor dies 106 can be coupled with the semiconductor die 104 in a rectangle pattern.

This disclosure now turns to a series of operations for fabricating semiconductor device assemblies in accordance with embodiments of the present technology. Specifically, FIGS. 2-5 illustrate simplified schematic cross-sectional views of a series of operations for fabricating semiconductor device assemblies in accordance with an embodiment of the present technology. The operations are illustrated with respect to a specific embodiment for ease of description. However, the operations described with respect to FIGS. 2-5 could be performed to fabricate semiconductor device assemblies in accordance with other embodiments.

Figure 2:
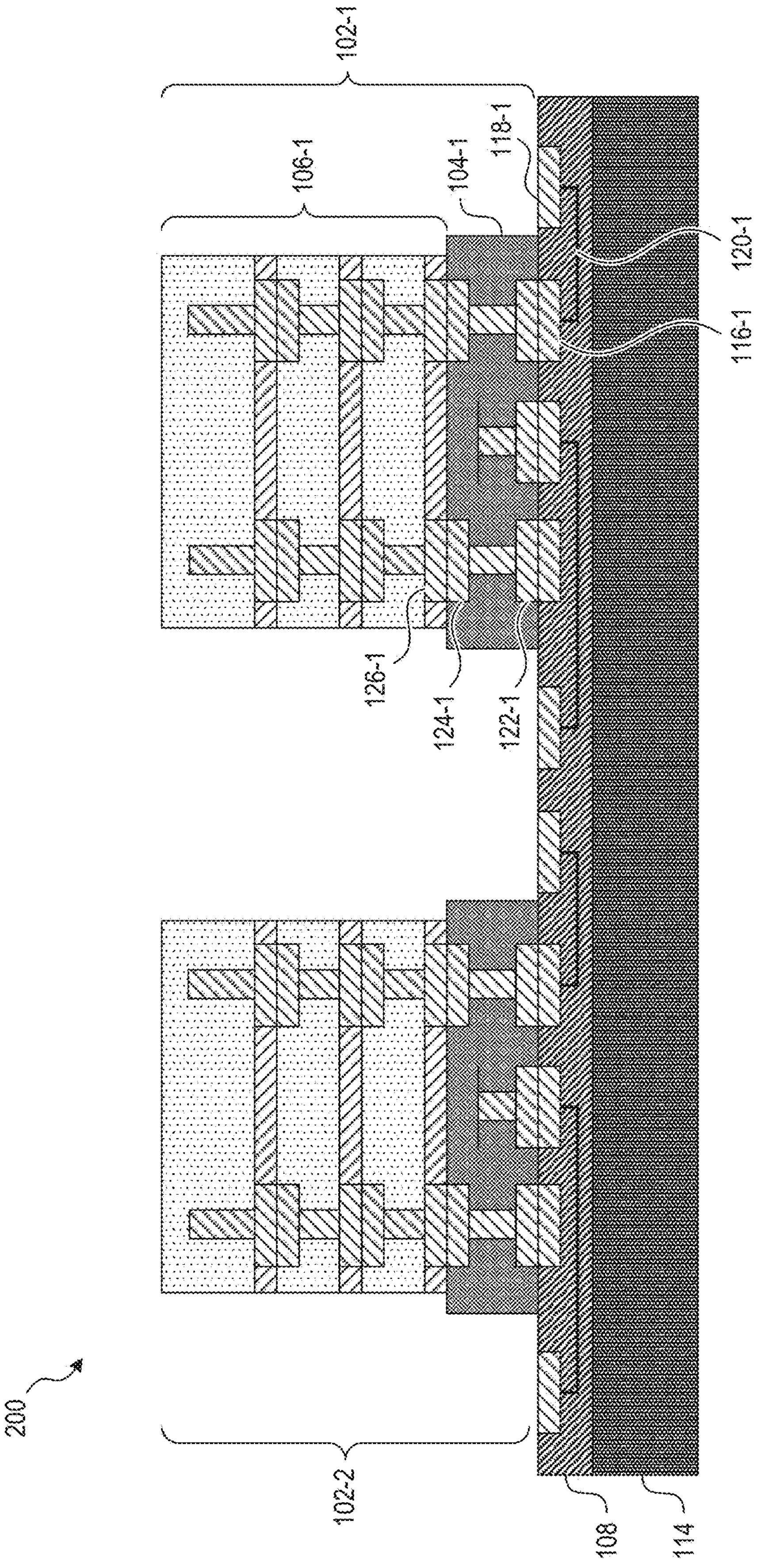
FIGS. 2-5 illustrate simplified schematic cross-sectional views of a series of steps for fabricating semiconductor device assemblies in accordance with embodiments of the present technology.

FIG. 2 illustrates a simplified schematic cross-sectional view of a semiconductor device assembly at stage 200, where stacks of semiconductor dies 102 (e.g., stack of semiconductor dies 102-1 and stack of semiconductor dies 102-2) are coupled to a redistribution layer 108. For the sake of brevity, various operations will be described with respect to the stack of semiconductor dies 102-1, and explicit description of the stack of semiconductor dies 102-2 and the various operations performed therewith are omitted. Unless otherwise noted, description of the stack of semiconductor dies 102-1, components related to the stack of semiconductor dies (denoted by the -1 suffix), or operations performed with respect to the stack of semiconductor dies 102-1 can apply similarly to the stack of semiconductor dies 102-2 and its related components. Moreover, although only two stacks of semiconductor dies 102 are illustrated, any number of stacks of semiconductor dies can be coupled with the redistribution layer 108 (e.g., a pre-built redistribution layer) at different lateral locations.

The redistribution layer 108 is disposed on the substrate 114. The substrate 114 can be a wafer-level substrate, and the redistribution layer 108 can include a plurality of individual redistribution units, each providing routing for a single semiconductor device assembly. Operations described herein are discussed as wafer-level operations for example only. In general, however, the operations disclosed herein can be performed at the die level for a single semiconductor device assembly or at the wafer or panel level for multiple semiconductor device assemblies. In some cases, the substrate 114 is a semiconductor substrate. In aspects, the substrate 114 can be of sufficient thickness to support the semiconductor device assembly during processing. The redistribution layer 108 can be formed by depositing layers of conductive material and layers of insulating material at the substrate 114. For example, conductive material can be deposited to form contact pads 116-1, at least one contact pad 118-1, and circuitry 120-1 such that the circuitry 120-1 couples the at least one contact pad 118-1 to one or more of the contact pads 116-1.

The stack of semiconductor dies 102-1 can then be coupled with the redistribution layer 108. As illustrated, the stack of semiconductor dies 102-1 includes a semiconductor die 104-1 (e.g., a logic die) and one or more semiconductor dies 106-1 (e.g., memory dies). The stack of semiconductor dies 102-1 can be coupled with the redistribution layer 108 in various portions or as a complete stack. For example, the stack of semiconductor dies 102-1, including the semiconductor die 104-1 and the semiconductor dies 106-1, can be cube-to-wafer bonded (e.g., hybrid bonded) to the redistribution layer 108. Alternatively, the semiconductor die 104-1 can be coupled (e.g., hybrid bonded) with the redistribution layer 108, and the semiconductor dies 106-1 can be stacked (e.g., hybrid bonded) to the semiconductor die 104-1 through a separate process. Each of the semiconductor dies 106-1 can be stacked to the semiconductor die 104-1 one at a time, or the entire stack of semiconductor dies 106-1 can be coupled with the semiconductor die 104-1 at once. In some cases, the semiconductor die 104-1 or the semiconductor dies 106-1 can be tested before being added to the assembly. In this way, yield can be improved by selecting “known good dies” or “known good cubes” for the stack of semiconductor dies 102-1.

The semiconductor die 104-1 is coupled to the redistribution layer 108 such that a front side of the semiconductor die 104-1 faces away from the redistribution layer 108, and the semiconductor dies 106-1 are coupled to the semiconductor die 104-1 such that the front sides of the semiconductor dies 106-1 face the semiconductor die 104-1. In general, the stack of semiconductor dies 102-1 is stacked to the redistribution layer 108 such that the semiconductor die 104-1 couples with the redistribution layer 108 and the semiconductor dies 106-1 couple with the semiconductor die 104-1. Specifically, contact pads 116-1 at the redistribution layer 108 couple with contact pads 122-1 at the semiconductor die 104-1, and contact pads 126-1 at one side of the semiconductor dies 106-1 couple with contact pads 124-1 disposed at the semiconductor die 104-1 opposite the contact pads 122-1. Once the stack of semiconductor dies 102-1 is attached to the redistribution layer 108, at least one contact pad 118-1 can be beyond the footprint of the stack of semiconductor dies 102-1 and left unconnected to the stack of semiconductor dies 102-1. As discussed above, the stack of semiconductor dies 102-2 can be similarly coupled with the redistribution layer 108 at a different lateral location.

Figure 3:
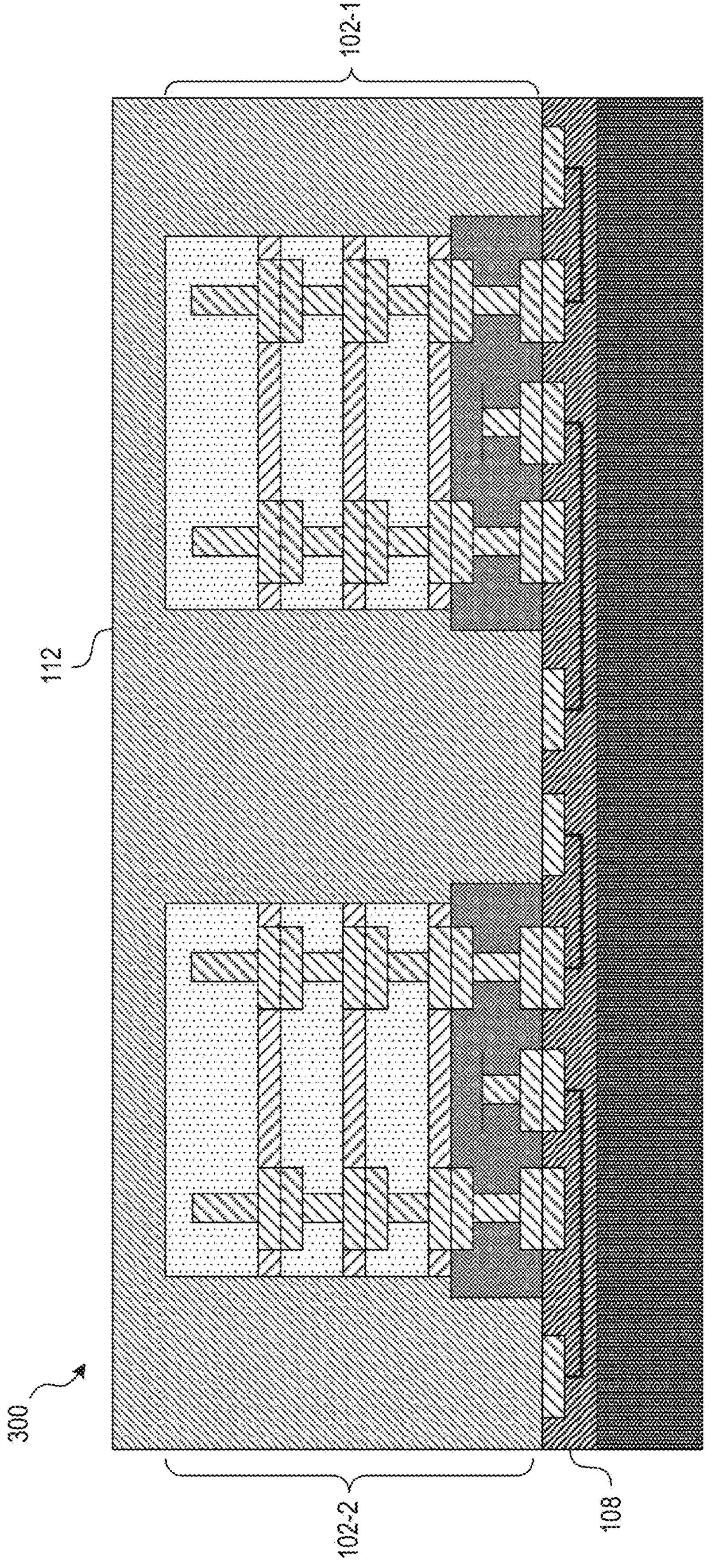

FIG. 3 illustrates a simplified schematic cross-sectional view of stage 300, where a gap fill 112 is disposed at redistribution layer 108 surrounding the stack of semiconductor dies 102-1 and the stack of semiconductor dies 102-2. In aspects, the gap fill 112 (e.g., dielectric fill, oxide fill, mold resin) can be disposed at a portion of the redistribution layer 108 exposed beyond the footprint of the stack of semiconductor dies 102-1 and the stack of semiconductor dies 102-2. The gap fill 112 can mechanically support and protect the semiconductor device assembly. In other aspects, the gap fill 112 can improve the thermal regulation of the semiconductor device assembly. In aspects, the gap fill 112 includes a dielectric material, such as silicon oxide, silicon nitride, silicon carbide, or silicon carbon nitride. The gap fill 112 can be disposed through any appropriate technique, for example, dispensing, chemical vapor deposition (CVD), or physical vapor deposition (PVD). As illustrated, the gap fill 112 can be disposed over a distal end of the stack of semiconductor dies 102-1 and the stack of semiconductor dies 102-2 opposite the redistribution layer 108.

Figure 4:
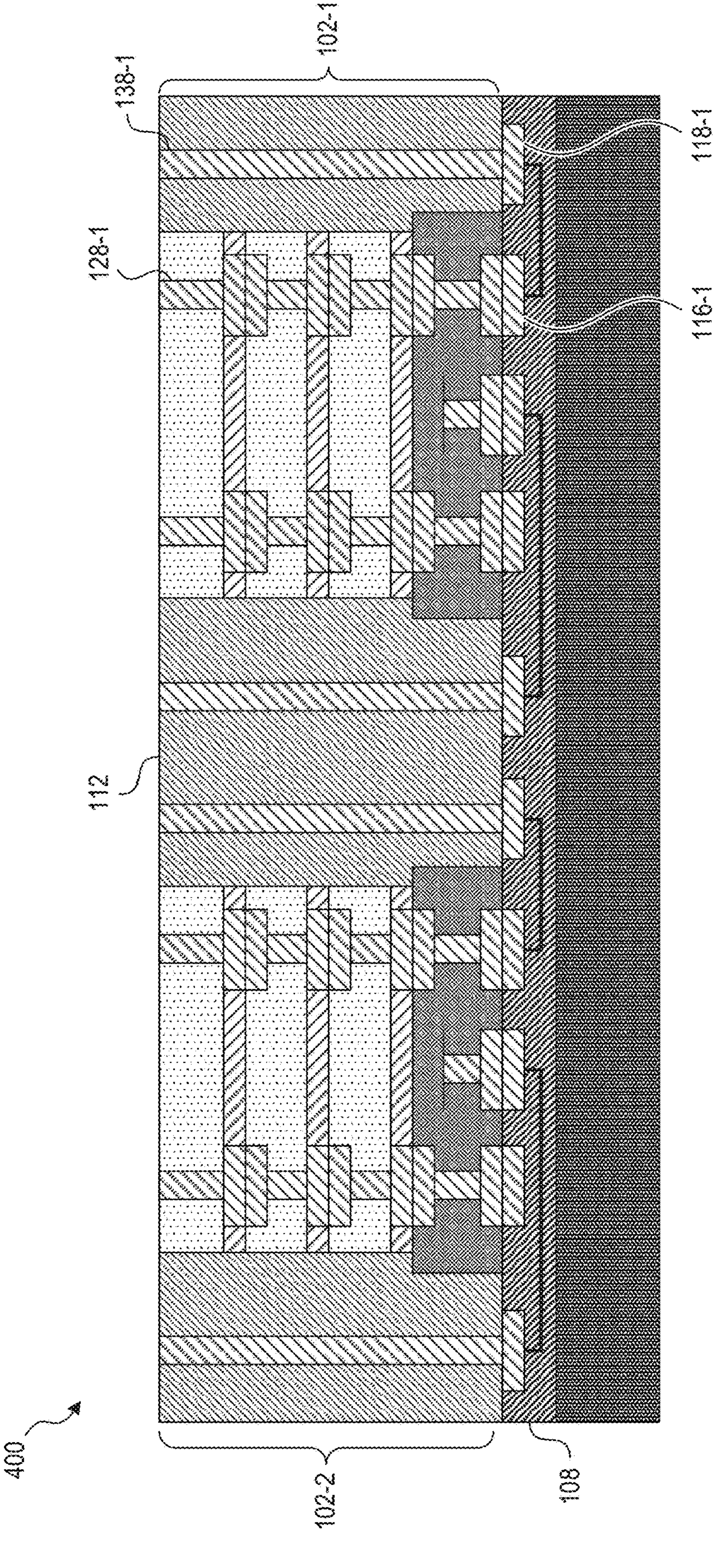

FIG. 4 illustrates a simplified schematic cross-sectional view of stage 400, where TSVs 128-1 are exposed and at least one through via 138-1 is implemented through the gap fill 112. For example, the gap fill 112 can be planarized (e.g., using chemical-mechanical planarization (CMP) or grinding) to create a planar surface distal from the redistribution layer 108. In some cases, the planarization can expose (e.g., and thin) the stack of semiconductor dies 102-1 and the stack of semiconductor dies 102-2 at a distal end opposite the redistribution layer 108. The planarization can expose the TSVs 128-1 at a distal end of the stack of semiconductor dies 102-1. In this way, electrical contact can be made with circuitry within the stack of semiconductor dies 102-1. In other cases, the planarization does not expose the stack of semiconductor dies 102-1 or the TSVs 128-1, and a portion of the gap fill 112 remains over a distal end of the stack of semiconductor dies 102-1. As a result, vias can be disposed through the gap fill 112 (and the distal end of the stack of semiconductor dies 102-1) to make electrical contact with the TSVs 128-1.

At least one through via 138-1 can be implemented through the gap fill 112 and be coupled with the at least one contact pad 118-1. For example, at least one opening can be created from the distal end of the gap fill 112 at a lateral location corresponding to the at least one contact pad 118-1. The at least one opening can extend entirely through the gap fill 112 to the at least one contact pad 118-1. In aspects, the at least one opening can be created through drilling (e.g., laser drilling). Conductive material can be deposited in the at least one opening to implement the at least one through via 138-1. The at least one through via 138-1 can thus electrically couple with the redistribution layer 108 through the at least one contact pad 118-1. Any number of through vias can be disposed through the gap fill 112. In aspects, the at least one through via 138-1 can be used to communicate power, ground, I/O, or other signals to/from the stack of semiconductor dies 102-1 through the redistribution layer 108. For example, the at least one through via 138-1 can couple with the at least one contact pad 118-1, and the at least one contact pad 118-1 can couple with one or more contact pads 116-1 coupled with the stack of semiconductor dies 102-1.

In some embodiments, a dummy through via can be created that at least partially extends through the gap fill 112. The dummy through via can be electrically isolated from circuitry at the redistribution layer 108 and thus be incapable of carrying signals to or from the stack of semiconductor dies 102-1. Instead, the dummy through dielectric via can be used to dissipate heat from the semiconductor device assembly.

Figure 5:
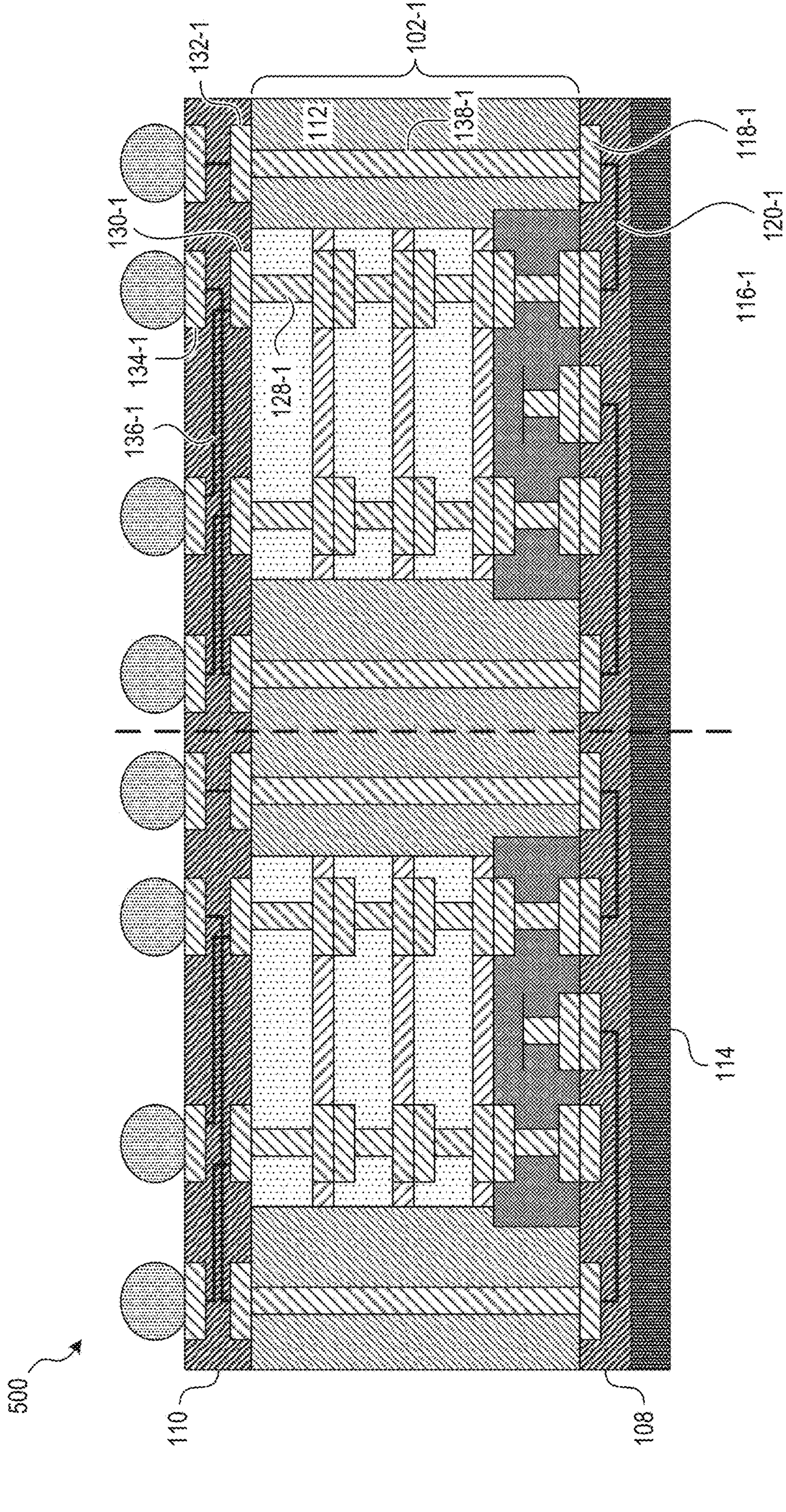

FIG. 5 illustrates a simplified schematic cross-sectional view of stage 500, where a redistribution layer 110 is disposed at the distal end of the stack of semiconductor dies 102-1 and the gap fill 112. In aspects, the redistribution layer 110 is a pre-built redistribution layer. The redistribution layer 110 include layers of conductive material and layers of insulating material arranged to form routing circuitry. The conductive material forms contact pads 130-1 coupled with the TSVs 128-1 and at least one contact pad 132-1 coupled to the through via 138-1. Insulating material at least partially covers the contact pads 130-1 and the at least one contact pad 132-1. Contact pads 134-1 (e.g., package-level contact pads) are disposed at the insulating material, and conductive material is disposed throughout the insulating material to implement circuitry 136-1 coupling the contact pads 134-1 with the contact pads 130-1 and the at least one contact pad 132-1. For example, a first subset of the contact pads 134-1 can couple with the contact pads 130-1 and a second subset of the contact pads 134-1 can couple with the at least one contact pad 132-1.

The contact pads 134-1 can be arranged in a configuration that matches one or more external components (e.g., a motherboard) to which the semiconductor device assembly attaches. For example, the contact pads 134-1 can be arranged in a BGA configuration. Solder balls or other connective structures can be disposed at the contact pads 134-1 to provide connectivity to external components that provide various functionality (e.g., power, ground, I/O signaling) to the semiconductor device assembly. Given that the at least one contact pad 132-1 couples with the at least one through via 138-1 and with one or more of the contact pads 134-1, various signaling (e.g., power, ground, I/O, or other signaling) can be communicated through the at least one through via 138-1. The at least one through via 138-1 can carry this signaling from the redistribution layer 110 to the redistribution layer 108. The signaling can then pass from the at least one contact pad 118-1 through the circuitry 120-1 to the contact pads 116-1 and into the stack of semiconductor dies 102-1. In doing so, connectivity can be provided to the stack of semiconductor dies 102-1 using a through via 138-1 extending through the gap fill 112 rather than utilizing limited circuit area in the stack of semiconductor dies 102-1 to implement through vias extending through the stack of semiconductor dies 102-1.

To reduce the thickness of the semiconductor device assembly, the substrate 114 can be thinned at a back side opposite the redistribution layer 108. The substrate 114 can be thinned after processing has been performed on the semiconductor assembly (e.g., after the gap fill 112 has been disposed, after the semiconductor dies 102 are attached, after the through vias 138-1 are created, or after the redistribution layer 110 is disposed) to enable the substrate to provide adequate mechanical support during processing of the semiconductor device assembly. The substrate 114 can be thinned through any appropriate method, including CMP or grinding. When the semiconductor device is assembled at the wafer level, the various stacks of semiconductor dies 102 can be singulated into individual semiconductor device assemblies. For example, the redistribution layer 110, the gap fill 112, and the redistribution layer 108 can be sawed between the stacks of semiconductor dies 102. Once singulated, the individual semiconductor device assemblies can be coupled with a larger system. For example, the semiconductor device assembly can be flipped such that the redistribution layer 110 is at the bottom and the solder balls (or other connective structures) disposed at the contact pads 134-1 can couple with an external component (e.g., a motherboard). Given that the contact pads 134-1 can be arranged in a particular configuration to be compatible with the external component to which the semiconductor device assembly is attached, an additional substrate may not be needed to support proper ball out of the assembly, thereby reducing thickness.

Although in the foregoing example embodiment semiconductor device assemblies have been illustrated and described as including a particular configuration of semiconductor dies, in other embodiments assemblies can be provided with different configurations of semiconductor dies. For example, the semiconductor device assemblies illustrated in any of the foregoing examples could be implemented with, for example, multiple stack of semiconductor dies or a single semiconductor die, mutatis mutandis.

In accordance with one aspect of the present disclosure, the semiconductor devices illustrated in the assemblies of FIGS. 1-5 could include memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could include memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could be logic dies (e.g., controller dies, processor dies, etc.), or a mix of logic and memory dies (e.g., a memory controller die and a memory die controlled thereby).

Figure 6:
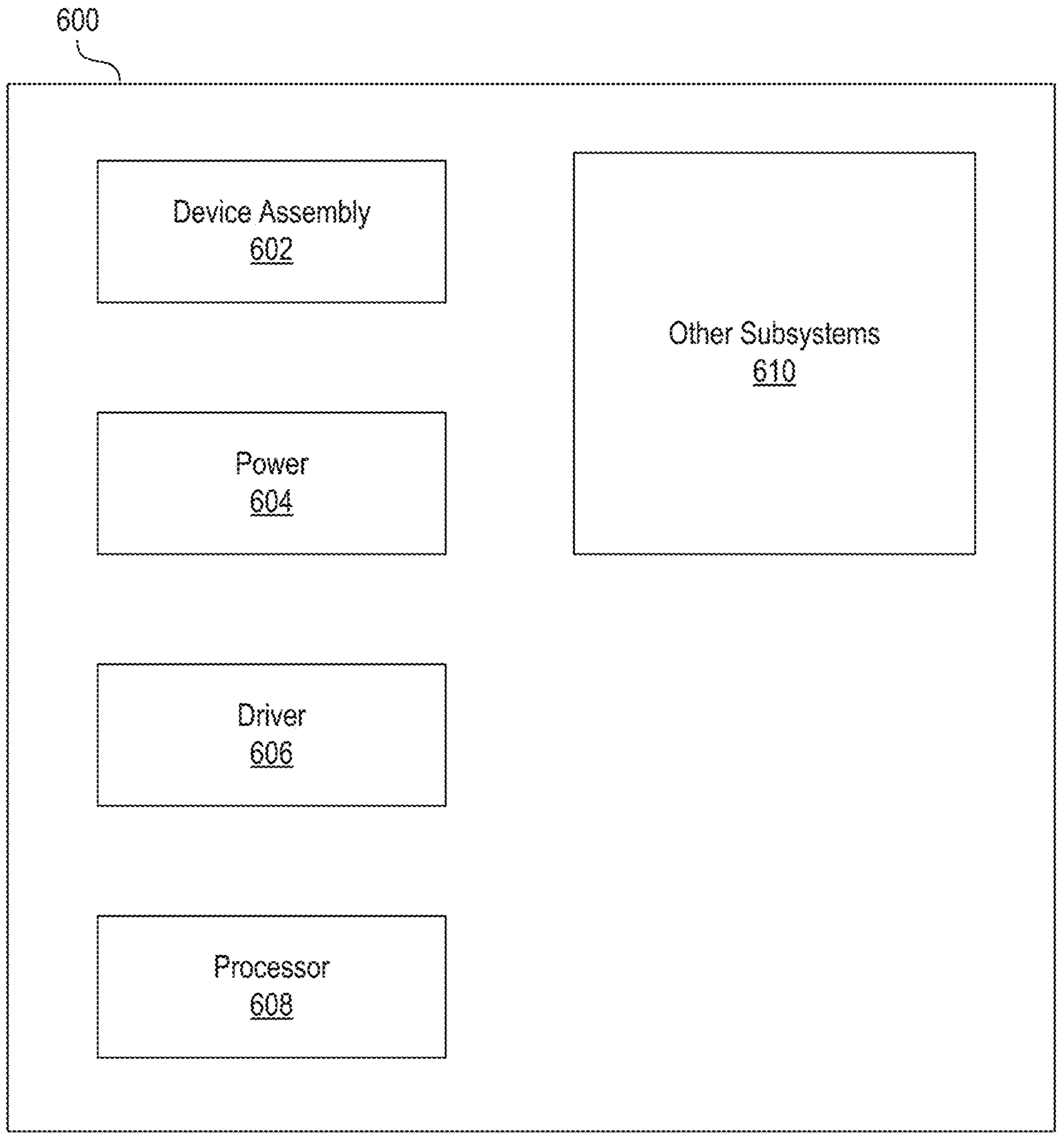
FIG. 6 illustrates a schematic view of a system that includes a semiconductor device assembly configured in accordance with an embodiment of the present technology.

Any one of the semiconductor devices and semiconductor device assemblies described above with reference to FIGS. 1-5 can be incorporated into any of a myriad of larger and/or more complex systems, a representative example of which is system 600 shown schematically in FIG. 6. The system 600 can include a semiconductor device assembly 602 (e.g., a discrete semiconductor device), a power source 604, a driver 606, a processor 608, and/or other subsystems or components 610. The semiconductor device assembly 602 can include features generally similar to those of the semiconductor device assemblies described above with reference to FIGS. 1-5. The resulting system 600 can perform any of a wide variety of functions, such as memory storage, data processing, and/or other suitable functions. Accordingly, representative systems 600 can include, without limitation, hand-held devices (e.g., mobile phones, tablets, digital readers, and digital audio players), computers, vehicles, appliances, and other products. Components of the system 600 may be housed in a single unit or distributed over multiple, interconnected units (e.g., through a communications network). The components of the system 600 can also include remote devices and any of a wide variety of computer-readable media.

Figure 7:
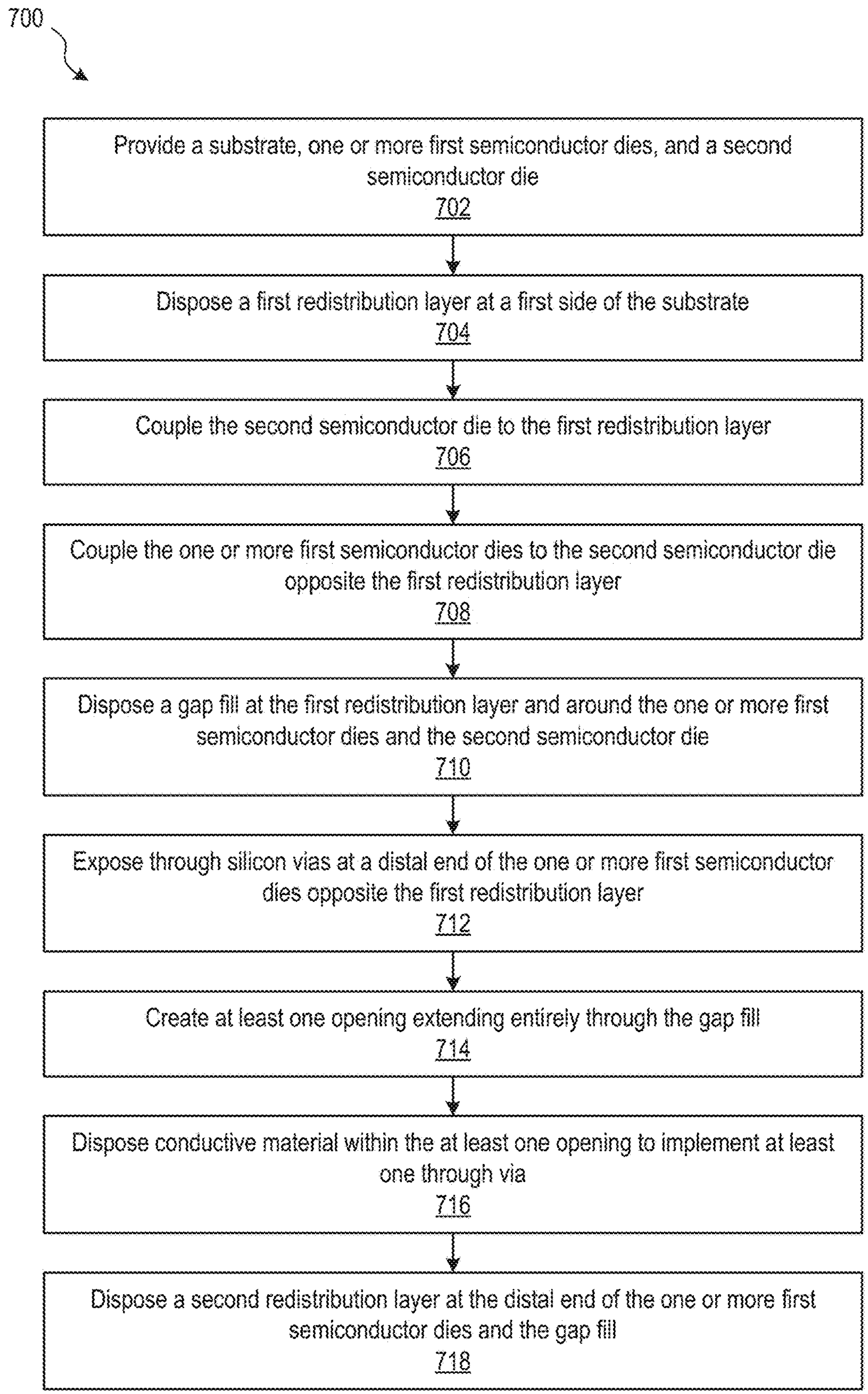
FIG. 7 illustrates a method of fabricating a semiconductor device assembly in accordance with an embodiment of the present technology.

FIG. 7 illustrates an example method 700 for fabricating a semiconductor device assembly in accordance with an embodiment of the present technology. Although illustrated in a particular configuration, one or more operations of the method 700 may be omitted, repeated, or reorganized. Additionally, the method 700 may include other operations not illustrated in FIG. 7, for example, operations detailed in one or more other methods described herein.

At 702, a substrate, one or more first semiconductor dies, and a second semiconductor die are provided. The substrate can include a semiconductor substrate or any other substrate on which a redistribution layer can be disposed. The one or more first semiconductor dies can include first circuitry (e.g., transistors, diodes, traces, lines, vias) providing functionality to the first semiconductor dies. In aspects, the one or more first semiconductor dies can include memory dies. In this way, the first circuitry can include one or more storage components capable of storing data. The second semiconductor dies can include second circuitry (e.g., transistors, diodes, traces, lines, vias) providing functionality to the second semiconductor die. In aspects, the second semiconductor dies can include a logic die. In this way, the second circuitry can include circuitry capable of controlling signaling (e.g., memory signaling) to the one or more second semiconductor dies.

At 704, a first redistribution layer is disposed at a first side of the substrate. The first redistribution layer can comprise layers of conductive material and layers of insulating material to implement various circuitry. For example, the first redistribution layer can include first contact pads, at least one second contact pad, and third circuitry (e.g., traces, lines, vias, or other connective elements) coupling the at least one second contact pad and one or more of the first contact pads.

At 706, the second semiconductor die is coupled to the first redistribution layer such that the first contact pads couple with the second circuitry and the at least one second contact pad is beyond a footprint of the second semiconductor die. The second semiconductor die can be attached to the first redistribution layer through any appropriate technique. For example, the second semiconductor die can be coupled with the second semiconductor die through hybrid bonding.

At 708, the first semiconductor dies are coupled to the second semiconductor die (e.g., in a vertical stack) opposite the first redistribution layer. The first semiconductor dies can couple with the second semiconductor die such that the first circuitry is coupled with the second circuitry through one or more interconnects. Like the second semiconductor die, the first semiconductor dies can be attached to the second semiconductor die through any appropriate technique, for example, hybrid bonding. In some embodiments, the second semiconductor die and the first semiconductor dies can be attached to the first redistribution layer in a single step. For example, the first semiconductor dies can be coupled with the second semiconductor die, and the stack, including the second semiconductor die and the first semiconductor dies, can be attached to the first redistribution layer.

At 710, a gap fill is disposed at the first redistribution layer and around the one or more first semiconductor dies and the second semiconductor die. In some embodiments, the gap fill can be a dielectric fill, such as silicon oxide, silicon nitride, silicon carbide, silicon carbon nitride, and so on. In aspects, the gap fill is an oxide fill, such as silicon oxide. In yet other aspects, the gap fill is an encapsulant, such as a mold resin. In some cases, the gap fill can be disposed over a distal end of the semiconductor dies opposite the first redistribution layer.

At 712, TSVs at a distal end of the one or more first semiconductor dies opposite the first redistribution layer are exposed. The TSVs are coupled with the first circuitry. For example, the TSVs can be exposed by thinning the gap fill and an upper die of the first semiconductor dies to expose TSVs at the upper die. In some embodiments, the gap fill and the upper die of the first semiconductor dies can be thinned through CMP or grinding.

At 714, at least one opening extending entirely through the gap fill to the at least one second contact pad is created. The opening can be created through drilling (e.g., laser drilling). The at least one opening corresponds to the at least one second contact pad such that the opening exposes the at least one second contact pad.

At 716, conductive material is disposed within the at least one opening to implement at least one through via extending through the gap fill to the at least one second contact pad. The conductive material can be disposed within the at least one opening through dispensing or any other appropriate technique. Once disposed, the conductive material can form a through via coupled with the at least one contact pad and disposed at a distal end of the gap fill and the semiconductor dies opposite the first redistribution layer.

At 718, a second redistribution layer is disposed at the distal end of the first semiconductor dies and the gap fill opposite the first redistribution layer. The second redistribution layer can comprise layers of conductive material and layers of insulating material to implement various circuitry. For example, the second redistribution layer can include third contact pads coupled with the exposed through silicon vias of the first semiconductor dies, at least one fourth contact pad coupled with the at least one through via extending through the gap fill, a layer of insulating material disposed at least partially over the third contact pads and the at least one fourth contact pad, fifth contact pads disposed at the layer of insulating material, and fourth circuitry (e.g., traces, lines, vias, or other connective elements) coupling a first subset of the fifth contact pads to the third contact pads and a second subset of the fifth contact pads to the at least one fourth contact pad. The layers of conductive material and insulating material can be disposed directly on the distal end of the gap fill and the first semiconductor dies. The fifth contact pads can be package-level contact pads that connect to external components with which the semiconductor device assembly is coupled. The external components can provide functionality (e.g., power, ground, I/O, or other signaling) to the semiconductor device assembly. Thus, various signaling can be provided to the semiconductor device assembly through the second redistribution layer, the through via extending through the gap fill, and the first redistribution layer.

Specific details of several embodiments of semiconductor devices, and associated systems and methods, are described above. Depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using CVD, PVD, plating, electroless plating, spin coating, and/or other suitable techniques. Similarly, materials can be removed, for example, using plasma etching, wet etching, CMP, or other suitable techniques.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device. Depending upon the context in which it is used, the term "substrate" can refer to a structure that supports electronic components (e.g., a die), such as a printed circuit board (PCB) or wafer-level substrate, a die-level substrate, or another die for die-stacking or 3DI applications.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or subregions of the substrate, may be controlled through doping using various chemical species including, but not limited to, phosphorous, boron, or arsenic. Doping may be performed during the initial formation or growth of the substrate, by ion implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:

a heterogeneous stack of semiconductor dies comprising a first semiconductor die and one or more second semiconductor dies;

a gap fill surrounding the heterogeneous stack of semiconductor dies;

a first redistribution layer disposed at a first side of the heterogeneous stack of semiconductor dies and the gap fill, the first redistribution layer comprising:

first contact pads disposed within a footprint of the heterogeneous stack of semiconductor dies and coupled with the first semiconductor die;

at least one second contact pad disposed beyond the footprint of the heterogeneous stack of semiconductor dies; and first circuitry coupling the at least one second contact pad and one or more of the first contact pads;

a second redistribution layer disposed at a second side of the heterogeneous stack of semiconductor dies and the gap fill opposite the first side, the second redistribution layer comprising:

third contact pads disposed within the footprint of the heterogeneous stack of semiconductor dies and coupled with at least one of the one or more second semiconductor dies, the third contact pads disposed at a third side of the second redistribution layer facing the heterogeneous stack of semiconductor dies;

at least one fourth contact pad disposed beyond the footprint of the heterogeneous stack of semiconductor dies and at the third side;

fifth contact pads disposed at a fourth side of the second redistribution layer opposite the third side; and second circuitry coupling a first subset of the fifth contact pads and the third contact pads and a second subset of the fifth contact pads and the at least one fourth contact pad; and at least one through via extending through the gap fill and coupling the at least one second contact pad and the at least one fourth contact pad.

2. The semiconductor device assembly of claim 1, wherein the first semiconductor die comprises a logic die and the one or more second semiconductor dies comprise memory dies.

3. The semiconductor device assembly of claim 1, further comprising a semiconductor substrate, wherein the first redistribution layer is disposed at the semiconductor substrate.

4. The semiconductor device assembly of claim 1, wherein the gap fill comprises a dielectric fill.

5. The semiconductor device assembly of claim 1, wherein the at least one through via is configured to provide power to the first semiconductor die through the at least one second contact pad, the first circuitry, and the one or more of the first contact pads.

6. The semiconductor device assembly of claim 1, wherein the at least one through via is configured to provide ground signaling to the first semiconductor die through the at least one second contact pad, the first circuitry, and the one or more of the first contact pads.

7. The semiconductor device assembly of claim 1, wherein the at least one through via is configured to provide input signaling or output signaling to the first semiconductor die through the at least one second contact pad, the first circuitry, and the one or more of the first contact pads.

8. A method for fabricating a semiconductor device assembly, comprising:

providing a substrate, one or more first semiconductor dies having first circuitry, and a second semiconductor die having second circuitry;

disposing a first redistribution layer at a first side of the substrate, the first redistribution layer comprising first contact pads, at least one second contact pad, and third circuitry coupling the at least one second contact pad to one or more of the first contact pads;

coupling the second semiconductor die to the first redistribution layer such that the first contact pads couple with the second circuitry and the at least one second contact pad is beyond a footprint of the second semiconductor die;

coupling the one or more first semiconductor dies to the second semiconductor die opposite the first redistribution layer such that the first circuitry couples with the second circuitry;

disposing a gap fill at the first redistribution layer and around the one or more first semiconductor dies and the second semiconductor die;

exposing through silicon vias at a distal end of the one or more first semiconductor dies opposite the first redistribution layer the through silicon vias coupled with the first circuitry;

creating at least one opening extending entirely through the gap fill to the at least one second contact pad;

disposing conductive material within the at least one opening to implement at least one through via extending through the gap fill to the at least one second contact pad; and disposing a second redistribution layer at the distal end of the one or more first semiconductor dies and a distal end of the gap fill opposite the first redistribution layer, the second redistribution layer comprising third contact pads coupled with the through silicon vias, at least one fourth contact pad coupled with the at least one through via, a layer of insulating material disposed at least partially over the third contact pads and the at least one fourth contact pad, fifth contact pads disposed at the layer of insulating material, and fourth circuitry coupling a first subset of the fifth contact pads to the third contact pads and a second subset of the fifth contact pads to the at least one fourth contact pad.

9. The method of claim 8, further comprising:

providing one or more third semiconductor dies and a fourth semiconductor die;

coupling the fourth semiconductor die to the first redistribution layer at a different lateral location from a lateral location at which the second semiconductor die is coupled;

coupling the one or more third semiconductor dies to the fourth semiconductor die opposite the first redistribution layer;

disposing the gap fill at the first redistribution layer and around the one or more third semiconductor dies and the fourth semiconductor die;

exposing additional through silicon vias at a distal end of the one or more third semiconductor dies opposite the first redistribution layer;

creating at least one additional opening extending entirely through the gap fill to the first redistribution layer;

disposing additional conductive material within the at least one additional opening to implement an additional through via extending through the gap fill to the first redistribution layer;

disposing the second redistribution layer at the distal end of the one or more third semiconductor dies and the distal end of the gap fill; and dicing the first redistribution layer, the substrate, the gap fill, and the second redistribution layer between the second semiconductor die and the fourth semiconductor die.

10. The method of claim 8, further comprising thinning the substrate opposite the first redistribution layer.

11. The method of claim 8, wherein exposing the through silicon vias comprises thinning the one or more first semiconductor dies at the distal end.

12. The method of claim 8, further comprising disposing solder at the fifth contact pads.

13. A semiconductor device assembly, comprising:

a stack of first semiconductor dies comprising first circuitry;

a second semiconductor die having second circuitry, the second semiconductor die coupled with the stack of first semiconductor dies such that first interconnects couple the first circuitry and the second circuitry;

a first redistribution layer coupled with the stack of first semiconductor dies opposite the second semiconductor die, the first redistribution layer comprising first contact pads disposed at a first side facing the stack of first semiconductor dies, at least one second contact pad disposed at the first side, third contact pads disposed at a second side opposite the first side, and third circuitry coupling a first subset of the third contact pads with the first contact pads and a second subset of the third contact pads with the at least one second contact pad, wherein the first contact pads couple with the first circuitry and the at least one second contact pad is disposed beyond a footprint of the stack of first semiconductor dies and the second semiconductor die;

a second redistribution layer coupled with the second semiconductor die opposite the stack of first semiconductor dies, the second redistribution layer comprising fourth contact pads disposed at a third side facing the second semiconductor die, at least one fifth contact pad disposed at the third side, and fourth circuitry coupling the at least one fifth contact pad with one or more of the fourth contact pads, wherein the fourth contact pads couple with the second circuitry and the at least one fifth contact pad is disposed beyond the footprint of the stack of first semiconductor dies and the second semiconductor die;

a gap fill disposed around the stack of first semiconductor dies and the second semiconductor die between the first redistribution layer and the second redistribution layer; and at least one through via extending entirely through the gap fill and coupling the at least one second contact pad and the at least one fourth contact pad.

14. The semiconductor device assembly of claim 13, wherein the stack of first semiconductor dies comprise memory dies and the second semiconductor die comprises a logic die.

15. The semiconductor device assembly of claim 13, wherein:

the fourth contact pads comprise a particular contact pad coupled with the second circuitry but not the first interconnects; and the fourth circuitry couples the at least one fifth contact pad with the particular contact pad.

16. The semiconductor device assembly of claim 13, wherein the at least one through via is configured to provide power to the second semiconductor die through the at least one fifth contact pad, the fourth circuitry, and the one or more of the fourth contact pads.

17. The semiconductor device assembly of claim 13, wherein the at least one through via is configured to provide ground signaling to the second semiconductor die through the at least one fifth contact pad, the fourth circuitry, and the one or more of the fourth contact pads.

18. The semiconductor device assembly of claim 13, wherein the at least one through via is configured to provide input signaling or output signaling to the second semiconductor die through the at least one fifth contact pad, the fourth circuitry, and the one or more of the fourth contact pads.

19. The semiconductor device assembly of claim 13, further comprising a semiconductor substrate at which the second redistribution layer is disposed.

20. The semiconductor device assembly of claim 13, further comprising:

one or more sixth contact pads disposed at the first side;

one or more additional third contact pads disposed at the second side and coupled with the one or more sixth contact pads through the third circuitry; and one or more pass-through vias extending through the stack of first semiconductor dies from the sixth contact pads to the second circuitry.

* * * * *